US011629057B2

United States Patent
Misra

(10) Patent No.: US 11,629,057 B2
(45) Date of Patent: Apr. 18, 2023

(54) METHOD OF GROWING POLYCRYSTALLINE DIAMOND MATERIAL SURROUNDING SINGLE CRYSTAL DIAMOND

(71) Applicant: IIA Technologies Pte Ltd., Singapore (SG)

(72) Inventor: Devi Shanker Misra, Singapore (SG)

(73) Assignee: IIA TECHNOLOGIES PTE. LTD., Singapore (SG)

( * ) Notice: Subject to any disclaimer, the term of this patent is extended or adjusted under 35 U.S.C. 154(b) by 342 days.

(21) Appl. No.: 16/761,234

(22) PCT Filed: Nov. 2, 2018

(86) PCT No.: PCT/SG2018/000006
§ 371 (c)(1),
(2) Date: May 1, 2020

(87) PCT Pub. No.: WO2019/088916
PCT Pub. Date: May 9, 2019

(65) Prior Publication Data
US 2020/0354223 A1    Nov. 12, 2020

(30) Foreign Application Priority Data
Nov. 3, 2017 (SG) .............................. 10201709086Q

(51) Int. Cl.
*C30B 25/04* (2006.01)
*C01B 32/26* (2017.01)
(Continued)

(52) U.S. Cl.
CPC .............. *C01B 32/26* (2017.08); *C01B 32/28* (2017.08); *C23C 16/042* (2013.01); *C23C 16/27* (2013.01);
(Continued)

(58) Field of Classification Search
CPC ......... C30B 25/00; C30B 25/02; C30B 25/04; C30B 25/12; C30B 25/16; C30B 25/18;
(Continued)

(56) References Cited

U.S. PATENT DOCUMENTS

| 7,837,793 B2 * | 11/2010 | Wort | ..................... C30B 25/02 117/200 |
| 2006/0213428 A1 * | 9/2006 | Meguro | .................. C30B 25/02 257/E21.123 |
| 2016/0315292 A1 * | 10/2016 | Han | ..................... C23C 16/042 |

FOREIGN PATENT DOCUMENTS

| JP | 2006-096643 | 4/2006 |
| RU | 2489532 | 8/2013 |
| WO | WO 2012/152661 | 11/2012 |

OTHER PUBLICATIONS

ISA/SG, "International Search Report" and "Written Opinion of the International Searching Authority," in PCT Application No. PCT/SG2018/000006, dated Jan. 30, 2019, 9 pages.
(Continued)

*Primary Examiner* — Kenneth A Bratland, Jr.
(74) *Attorney, Agent, or Firm* — Kang S. Lim

(57) ABSTRACT

A method of a growing an embedded single crystal diamond structure, comprising: disposing a single crystal diamond on a non-diamond substrate, wherein the non-diamond substrate is larger than the single crystal diamond; masking a top portion of the single crystal diamond using a masking material; and using a chemical vapor deposition (CVD) growth chamber, growing polycrystalline diamond material surrounding the single crystal diamond in order to join the single crystal diamond to the polycrystalline diamond material.

9 Claims, 4 Drawing Sheets

(51) Int. Cl.
| | |
|---|---|
| *C01B 32/28* | (2017.01) |
| *C23C 16/04* | (2006.01) |
| *C23C 16/27* | (2006.01) |
| *C23C 16/56* | (2006.01) |
| *C30B 29/04* | (2006.01) |
| *C30B 33/08* | (2006.01) |

(52) U.S. Cl.
CPC .............. *C23C 16/56* (2013.01); *C30B 29/04* (2013.01); *C30B 33/08* (2013.01); *C01P 2004/61* (2013.01); *C01P 2004/88* (2013.01); *C01P 2006/80* (2013.01)

(58) Field of Classification Search
CPC ......... C30B 28/00; C30B 28/12; C30B 29/00; C30B 29/02; C30B 29/04; C30B 33/08; C23C 16/04; C23C 16/042; C23C 16/22; C23C 16/26; C23C 16/27; C23C 16/56; C01B 32/26; C01B 32/28
USPC .................. 117/84, 88, 94–95, 97, 101, 106, 117/928–929
See application file for complete search history.

(56) References Cited

OTHER PUBLICATIONS

ISA/SG, International Preliminary Report on Patentability, in PCT Application No. PCT/SG2018/000006, dated Feb. 24, 2020, 58 pages.

\* cited by examiner

US 11,629,057 B2

METHOD OF GROWING POLYCRYSTALLINE DIAMOND MATERIAL SURROUNDING SINGLE CRYSTAL DIAMOND

CROSS-REFERENCE TO RELATED APPLICATIONS

The present application is a United States National Stage entry under 35 U.S.C. § 371 of International Application No. PCT/SG2018/000006 filed Nov. 2, 2018, designating the United States of America and published in English on May 9, 2019, which in turn claims priority to Singapore Application No. 10201709086Q, filed on Nov. 3, 2017, all of which are incorporated herein by reference in their entirety.

FIELD OF INVENTION

The present invention relates to single crystal diamond embedded in polycrystalline diamond and a method of growing it.

BACKGROUND

Diamonds are well known for its unparalleled physical, optical and electrical properties. Advances in diamond growth technologies such as chemical vapour deposition (CVD) and high-pressure and high-temperature (HPHT) has enabled obtainment of diamonds with desired, controllable and reproducible properties.

Generally, diamonds grown using the abovementioned growth technologies can be a monocrystalline diamond (i.e., a single crystal diamond) or a polycrystalline diamond (i.e., a multi-grain diamond). In most instances, the single crystal diamond have significantly better properties than a polycrystalline diamond. However, adopting fully to single crystal diamonds in all fathomable applications have been curtailed mostly by two problems, i.e., industrial scalability and handling feasibility. Hence, in such cases, the polycrystalline diamond and/or other alternative materials seem to have dominated and continued to be favorable.

Take for example a material choice for a bare/unprocessed wafer. The superior qualities of a single crystal diamond would always make it a preferable choice material for a wafer, in which electronic circuits can be formed. However, up to this date, diamond growth industry is unable to form a sufficiently large single crystal diamond in order to make a viable industrial option to replace other commonly used materials (e.g., silicon).

Another example is handling feasibility of a thin-film single crystal diamond. The superior properties of the thin-film single crystal diamond is highly appreciated in a radiation detector specifically for radioactive therapy treatment, which is being developed to fight diseases such as cancer. The radiation detector is utilized to transmit proton to a selected area (e.g., targeted cells on the body, etc.). Such precision is only enabled because of the superior properties of the single crystal diamond as a transmission channel for the protons without dampening or affecting the protons trajectory. However, the thin-film single crystal diamonds are usually brittle and may easily cleave whenever being handled.

Therefore, it is the object of this invention to resolve the above-mentioned challenges faced by the single crystal diamond.

SUMMARY

A summary of certain embodiments disclosed herein is set forth below. It should be understood that these aspects are presented merely to provide the reader with a brief summary of these certain embodiments and that these aspects are not intended to limit the scope of this disclosure. Indeed, this disclosure may encompass a variety of aspects that may not be set forth below.

In one embodiment, a method of growing an embedded single crystal diamond structure is provided. The method includes a step to dispose a single crystal diamond on a non-diamond substrate, wherein the non-diamond substrate is larger than the single crystal diamond. The method further includes a step to mask a top portion of the single crystal diamond using a masking material. Finally, the method includes a step to grow polycrystalline diamond material surrounding the single crystal diamond in order to join the single crystal diamond to the polycrystalline diamond using a chemical vapor deposition (CVD) growth method.

In another embodiment, the method stated in the above embodiment may grow an embedded single crystal diamond structure. The embedded single crystal diamond structure includes a single crystal diamond and a polycrystalline diamond. The polycrystalline diamond surrounds the single crystal diamond, wherein the single crystal diamond is disposed in such manner as to be suspended between the polycrystalline diamond.

Various refinements of the features noted above may exist in relation to various aspects of the present disclosure. Further features may also be incorporated in these various aspects as well.

These refinements and additional features may exist individually or in any combination. For instance, various features discussed below in relation to one or more of the illustrated embodiments may be incorporated into any of the above-described aspects of the present invention alone or in any combination. Again, the brief summary presented above is intended only to familiarize the reader with certain aspects and contexts of embodiments of the present disclosure without limitation to the claimed subject matter.

BRIEF DESCRIPTION OF DRAWINGS

Various aspects of this disclosure may be better understood upon reading the following detailed description and upon reference to the drawings in which.

DETAILED DESCRIPTION

One or more specific embodiments will be described below. In an effort to provide a concise description of these embodiments, not all features of an actual implementation are described in the specification. It should be appreciated that in the development of any such actual implementation, numerous implementation-specific decisions must be made to achieve the specific goals of diamond growths, which may vary from one implementation to another. Moreover, it should be appreciated that such efforts might be complex and time consuming, but would nevertheless be a routine undertaking of those of ordinary skill having the benefit of this disclosure.

As discussed in further details below, embodiments of the present disclosure relate generally to an embedded single crystal diamond in a polycrystalline diamond frame. Indeed, such an embedded single crystal diamond may be utilized in multiple applications such as:

Mechanical applications such as viewing windows in abrasive atmosphere, cutting, and wear applications.

Optical applications such as etalon, laser window, optical reflectors, diffractive optical elements, anvil etc.

Electronic applications such as detectors, heat spreaders, high power switches at power stations, high-frequency field-effect transistors and light-emitting diodes, etc.

Microwave applications such as window-gyrotron, microwave components, antenna,

Acoustic applications such as surface acoustic wave (SAW) filter,

Aesthetic applications such as gemstones, and many other applications.

Figure 1A:
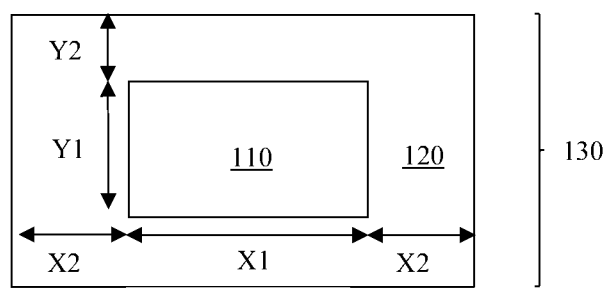
FIGS. 1A and 1B show an illustrative embedded single crystal diamond structure in accordance with one embodiment of the present invention.
Figure 1B:
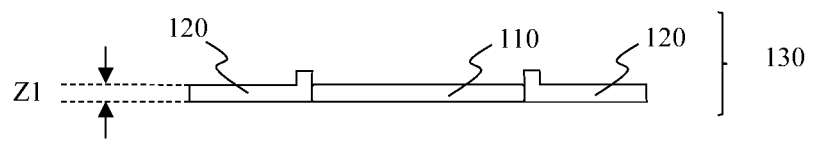

FIGS. 1A and 1B, meant to be illustrative and not limiting, illustrates an embedded single crystal diamond structure. FIGS. 1A and 1B illustrate top and side views, respectively, of embedded single crystal diamond structure 130.

The embedded single crystal diamond structure 130 includes single crystal diamond 110 and polycrystalline diamond material 120. As shown in FIG. 1A, the polycrystalline diamond material 120 fully surrounds peripheral edges of single crystal diamond 110.

The embedded single crystal diamond structure 130 can be used in a variety of applications. Specifically, embedded single crystal diamond structure 130 can be used in optical, detector, semiconductor and/or electronic fields as per the provided abovementioned list.

In addition to that, embedded single crystal diamond structure 130 may also overcome the challenges described in the background, in one embodiment. However, without deviating from the general inventive concept of the invention, it should be appreciated that not every variation of claimed inventions is capable of overcoming the problems described in the background.

In one embodiment, embedded single crystal diamond structure 130 may not cleave even when single crystal diamond 110 is a thin-film single crystal diamond having a thickness of less than 20 microns. The apparatus/machine (e.g., a detector in a radioactive therapy application) may hold onto the thick portion of embedded single crystal diamond structure 130 (i.e., polycrystalline diamond material 120) and therefore overcome the handling feasibility problem.

In one embodiment, single crystal diamond 110 may be a mined diamond or a grown diamond. The grown diamond can be grown using a chemical vapor deposition (CVD) growth process or a high pressure high temperature (HPHT) growth process. The CVD growth process is preferred to obtain a consistently pure diamond.

Furthermore, single crystal diamond 110 can also form a semiconductor. In one exemplary embodiment, single crystal diamond 110 forms into a semiconductor by implanting specific types of dopants (e.g., boron, etc.). It should be appreciated that upon doping, single crystal diamond 110 may also be referred to as a doped single crystal diamond 110 (e.g., a boron doped single crystal diamond). Doping single crystal diamond 110 with specific types of dopants may form a semiconducting material such as negative type (N-type), positive type (P-type) and/or N+P types. In addition to that, single crystal diamond 110 can also be an isotopically pure diamond or isotopically enriched diamond. In one embodiment, single crystal diamond 110 may be an isotopically enriched or pure diamond having either $^{13}C$ or $^{12}C$.

Referring still to FIG. 1A, single crystal diamond 110 may have its two orthogonal lengths with dimensions of X1 and Y1. In one embodiment, the values of X1 and Y1 may be 1 millimeter (mm) and 1 mm, respectively. In such embodiment, an area encompassed by a surface of single crystal diamond 110 is 1 $mm^2$. In another embodiment, the values of X1 and Y1 may be 2 mm and 2 mm, respectively. In such embodiment, an area encompassed by a surface of single crystal diamond 110 is 4 $mm^2$. Generally, the size of an area is highly dependable on the applications in which single crystal diamond 110 will be utilized. For example, a radiation therapy application apparatus would require single crystal diamond 110 having a size of at least 1 $mm^2$. In another example, a semiconductor application would require single crystal diamond 110 having a size of at least 4 $mm^2$.

Now referring to FIG. 1B, thickness of single crystal diamond 110 is represented by dimension Z1. A person skilled in the art appreciates that thickness of single crystal diamond 110 may vary with the applications of embedded single crystal diamond structure 130. In one exemplary embodiment, the value of Z1 may be 20 microns ($\mu m$). In the radioactive therapy application as stated previously, where thin-film single crystal diamonds are desired, the value of Z1 may be 2 $\mu m$ or less. In another exemplary embodiment, in the applications where thick single crystal diamonds are preferred, the value of Z1 are in terms of millimeters (e.g., greater than 0.2 mm).

Single crystal diamond 110 may be a relatively pure diamond. In one embodiment, such pure single crystal diamond 110 may have one or more of these listed characteristics:

a) Single substitutional nitrogen (Ns) <1 part per billion (ppb);

b) Thermal conductivity >1500 Watts per meter per Kelvin ($Wm^{-1}K^{-1}$) at 300K;

c) Charge collection distance, when measured using Alpha and Beta sources, having a full collection >0.1 Voltage per each micron (V/$\mu m$)

d) Charge collection efficiency is 100%>0.1 V/$\mu m$;

e) Carrier lifetime for electrons at 300 K is >21.4+/−5.5 nanoseconds (ns);

f) Carrier lifetime for holes at 300 K is >25.65+/−1.3 ns;

g) Birefringence of less than $\Delta n < 1 \times 10^{-4}$;

h) Optical transmission between 70% to 71%, at 10.6 $\mu m$; and/or i) Rocking curve width of >7 $\mu Rad$.

It should be appreciated that the required characteristic of single crystal diamond 110 depends on its application. For example, in the semiconductor applications, it is preferable to have almost all of the above mentioned characteristics (i.e., characteristics (a)-(i)). Alternatively, in the optical applications, it is preferable to have at least have a portion of the above mentioned characteristics (e.g., characteristics (g)-(h)).

Single crystal diamond 110 may be in a form of a plate. The plate may be a parallel-sided plate. In one embodiment, the plate may have six surfaces. In such embodiment, the top and bottom surfaces of single crystal diamond 110 is of crystallographic orientations (100) and the side surfaces of single crystal diamond 110 is of crystallographic orientations (110). In another exemplary embodiment, where the plate may also have six surfaces but will all the surfaces having crystallographic orientations (100). In another exemplary embodiment, where the plate may also have six surfaces but will all top and bottom surfaces having crystallographic orientations (111) and the side surfaces of any other crystallographic orientations (111, 110, 100, etc.).

Referring still to FIGS. 1A and 1B, polycrystalline diamond material 120 surrounds entire peripheral edge of single crystal diamond 110. Dimensions of polycrystalline diamond material 120 formed from edges of single crystal diamond 110 may be represented by X2 and Y2. In one embodiment, the value of X2 may be more than 0.5 mm. The values of X2 and Y2 can be increased depending on the applications. For example, applications that require bigger surface of polycrystalline to enable easier handling, would have large X2 and Y2 values. It should be noted that in the embodiments where single crystal diamond 110 is having only a small area (e.g., dimensions of X1 and Y1 of 10 µm and 10 µm, respectively, or less), the values of X2 and Y2 may still remain 0.5 mm and 0.5 mm, respectively, or more. The purpose to maintain the X2 and Y2 values is to provide sufficient are for easier handling.

Notwithstanding the embodiment described in FIGS. 1A and 1B, polycrystalline diamond material 120 may also be formed to surround only a portion of selected peripheral edges of single crystal diamond 110. In other words, polycrystalline diamond material 120 may not be surrounding the entire peripheral edge of single crystal diamond 110. The purpose to surround polycrystalline diamond material 120 around selected peripheral edges of single crystal diamond 110 is to do bare minimum while providing sufficient structural holding support and handling area.

FIG. 1B also shows thickness of polycrystalline diamond material 120. As shown in FIG. 1B, the thickness of single crystal diamond 110 is similar to polycrystalline diamond material 120 (i.e., Z1) with the exception of sides that are closest to single crystal diamond 110, in one embodiment.

Figure 2A:
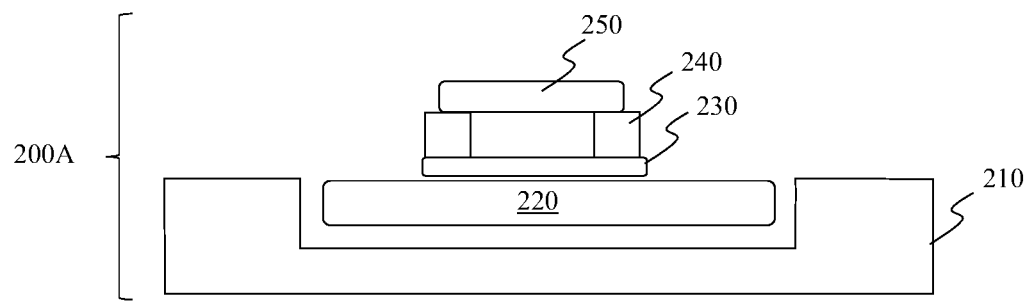
FIGS. 2A, 2B and 2C show illustrative different formation stages of the embedded single crystal diamond structure of FIGS. 1A and 1B in accordance with one embodiment of the present invention.
Figure 2B:
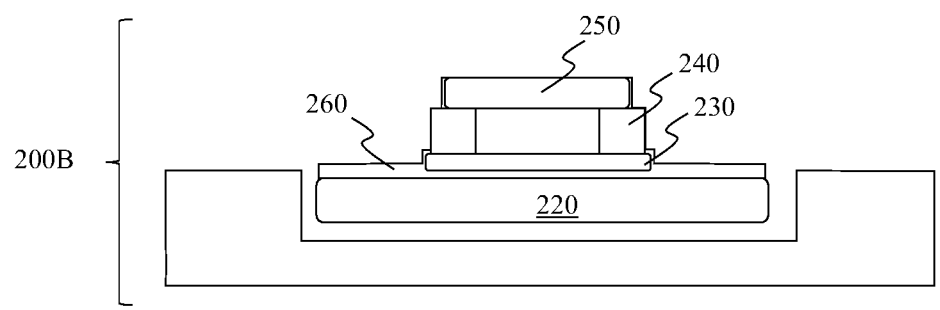
Figure 2C:
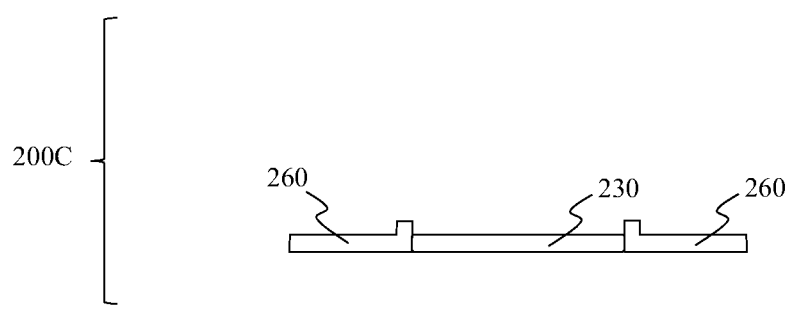

Further elaboration on the reasons in which the sides of polycrystalline diamond material 120 differ in thickness than bulk polycrystalline diamond material 120 will be provided through FIGS. 2A-2C. Nevertheless, in one embodiment, such uneven thickness along polycrystalline diamond material 120 can be avoided using an additional polishing process and/or etching process.

It should be appreciated that thickness of polycrystalline diamond material 120 may be fixed whereas thickness of single crystal diamond 110 depends on the application. For example, a thickness of single crystal diamond 110 and polycrystalline diamond material 120 may be similar when single crystal diamond 110 is having a thickness of more than 200 µm. However, in the embodiments where the thickness of single crystal diamond 110 is relatively small (e.g., in the case of thin-film single crystal diamond that has a thickness of 2 µm), then the thickness of polycrystalline diamond material 120 and single crystal diamond 110 will differ. In such embodiments, the thickness of polycrystalline diamond material 120 will still remain more than 200 µm. In such situation, embedded single crystal diamond structure 130 may have uneven surface. In one embodiment, such uneven surface may be similar to a "valley-like" surface whereby the thin-film single crystal diamond 110 forms the base of the valley. In another embodiment, single crystal diamond 110 may be suspended mid-way through the thickness of polycrystalline diamond material 120 and form a structure that is similar to a "dumbbell" structure. The thickness of polycrystalline diamond material 120 remains the same in order to enable easy-handling of such thin-film single crystal diamond 110.

In one embodiment, the purity level of polycrystalline diamond material 120 may be similar to single crystal diamond 110. In an embodiment where single crystal diamond 110 is having a highest purity level single crystal diamond (i.e., having all the above-mentioned characteristics (a)-(i)), the purity level of polycrystalline diamond material 120 ought to be also somewhat near to the purity level of single crystal diamond 110. Similar purity levels of single crystal diamond 110 and polycrystalline diamond material 120 ensures that there is no mismatch in the properties between two different materials, which has generally played a limiting role in post-processing steps. In one embodiment, the similarities in the purity levels may enable mechanical polishing of the entire top or bottom surface of embedded single crystal diamond 130. In an alternative embodiment, the similar purity level may also enable further formation of other structures without large characteristic mismatches between single crystal diamond 110 and polycrystalline diamond material 120.

In one embodiment, characteristics of polycrystalline diamond material 120 may be similar to a polycrystalline diamond used for optical applications. The characteristics may include Fourier-transform infrared spectroscopy (FTIR) values at 10.6 µm of at least 70%.

The joint at the boundary of the single crystal diamond 110 and polycrystalline diamond material 120 is seamless and almost non-visible. Furthermore, the boundary between single crystal diamond 110 and polycrystalline diamond material 120 is also non-porous. A Raman FWHM was measured at room temperature using 514 nanometer (nm) laser along the seamless and almost non-visible boundary. In one embodiment, the Raman FWHM for single crystal diamond 110 near the boundary is 2 cm$^{-1}$ and for polycrystalline diamond material is 2.5 cm$^{-1}$. Each of these values indicate a well-defined, seamless and almost non-visible transition between single crystal diamond 110 and polycrystalline diamond 120. Hence, such perfect transition may enable usage of the embedded single crystal diamond structure 130 in any vacuum compatible applications (e.g., optical window for a detector).

It should be appreciated that the polycrystalline diamond material may be described as a form of diamond material made up of randomly oriented crystallites and containing large-angle grain boundaries, twin boundaries, or both. In contrast, single crystal diamond material is a material in which the crystal lattice of the diamond is continuous and unbroken to the edges of the sample, with no grain boundaries.

In one embodiment, a method of a growing an embedded single crystal diamond structure is provided. The method includes a step to dispose a single crystal diamond on a non-diamond substrate, wherein the non-diamond substrate is larger than the single crystal diamond. The method further includes a step to mask a top portion of the single crystal diamond using a masking material. Finally, the method includes a step to grow polycrystalline diamond material surrounding the single crystal diamond in order to join the single crystal diamond to the polycrystalline diamond using a chemical vapor deposition (CVD) growth method.

FIGS. 2A-2C, meant to be illustrative and not limiting, shows formation stages 200A, 200B and 200C, respectively, when growing an embedded single crystal diamond structure in accordance with one embodiment of the present invention. The embedded single crystal diamond structure in FIGS. 2A-2C may be similar to embedded single crystal diamond structure 130 of FIGS. 1A and 1B, in one embodiment.

FIG. 2A, meant to be illustrative and not limiting, an initial formation stage of an embedded single crystal diamond structure in accordance with one embodiment of the present invention. The initial formation stage 200A includes a stacked structure made from non-diamond substrate 220, single crystal diamond 230, frame structure 240 and masking material 250. This structure is further placed on a substrate holder 210 of a CVD growth chamber.

As shown in FIG. 2A, single crystal diamond 230 is disposed on top of non-diamond substrate 220. In one embodiment, non-diamond substrate 220 may be silicon, silicon carbide (SiC), tungsten, and/or any other suitable material. Non-diamond substrate 220 is used as a base for the growth of polycrystalline diamond. In one embodiment, single crystal diamond 230 position relative to non-diamond substrate 220 may be as such so as to address the handling issue and/or formation of array issue. FIG. 2A shows single crystal diamond 230 is placed substantially central of non-diamond substrate 220. The central placement may enable polycrystalline diamond material growth surrounding single crystal diamond 230. Alternatively, single crystal diamond 230 is placed on the edge of non-diamond substrate 220. Such placement will enable growth of the polycrystalline diamond material on one or more edges of single crystal diamond 230, similar to as described in FIGS. 1A and 1B.

Single crystal diamond 230 may be in a form of a plate. The plate may be a parallel-sided plate. Each of these plates may have six surface. In one embodiment, top and bottom surfaces of single crystal diamond 230 is of (100) crystallographic orientations and side surfaces of single crystal diamond 230 have (110) crystallographic orientations.

Referring still to FIG. 2A, frame structure 240 surrounds peripheral edges of single crystal diamond 230. Frame structure 240 may be utilized for preventing any polycrystalline growth on single crystal diamond 230.

In another embodiment, the frame structure 240 may surround only a portion of an area of the single crystal diamond that should abstain from any polycrystalline diamond growth. In such embodiment, the single crystal diamond that is outside frame structure 240 would grow diamond whereas single crystal diamond 230 that is within frame structure 240 would not. Frame structure 240 may be composed from a diamond material or a silicon material. It should be appreciated that frame structure 240 may be similar to a wall structure although in FIGS. 2A-2B, frame structure 240 seems like two stand-alone pillars.

Disposed above the frame structure 240 is masking material 250. As shown in FIG. 2A, masking material 250 is fully covering the top surface of single crystal diamond 230. Masking material 250, as the name suggests, is used to isolate an area on single crystal diamond 230 from any growth. Masking material 250 blocks the growth by disabling the gas or plasma to reach a surface of single crystal diamond 230. Hence, there will not be any growth in the area that is surrounded by frame structure 240 and blocked by the masking material. In one embodiment, the masking material 250 may be composed from silicon carbide.

As stated above, the structure in initial formation stage 200A is disposed above substrate holder 210. The substrate holder 210 is generally a substrate used for CVD growth process. In one embodiment, substrate holder 210 is a molybdenum (Mo) and does not include any intentional placement of diamond seed or diamond nucleation site to enable the polycrystalline diamond material growth.

FIG. 2B, meant to be illustrative and not limiting, shows post-growth formation stage 200B immediately after a growth state in accordance with one embodiment of the present invention. In one embodiment, the only difference between initial formation stage 200A of FIG. 2A and post-growth formation stage 200B of FIG. 2B is a layer of polycrystalline diamond 260. Polycrystalline diamond 260 is grown using a polycrystalline diamond growth process. It is clearly seen from the FIG. 2B that polycrystalline diamond 260 is disposed immediately above the exposed-to-plasma area of non-diamond substrate 220, single crystal diamond 230, frame structure 230 and masking material 250. In one embodiment, the growth process may be sufficiently a long process that grows polycrystalline diamond 260 having a thickness of at least 1-2 mm.

In one embodiment, the growth process of polycrystalline diamond using the CVD method may include supplying a gas having at least 0.5% to 10% of methane ($CH_4$) in hydrogen in to a CVD growth chamber. The growth conditions are to be at least in the range of 750 degree Celsius to 1250 degree Celsius. The pressure conditions are in a range of 100 kiloPascal (KPA) to 300 KPa. FIG. 2C, meant to be illustrative and not limiting, illustrates a final formation stage of forming the embedded single crystal diamond structure. In one embodiment, final formation stage 200C may be similar to embedded single crystal diamond structure 130 of FIGS. 1A and 1B. Final formation stage 200C may be achieved by removing the non-diamond substrate from the bottom of single crystal diamond 230 and by removing frame structure 240 and masking material 250. It should be appreciated that the non-diamond substrate, frame structure 240 and masking material 250 may be easily removed as they merely get detached after the growth of the polycrystalline diamond material 260.

As shown in FIG. 2C, thickness of the sides of polycrystalline diamond material 260 near to single crystal diamond 230 differ than the thickness of the remaining portion of polycrystalline diamond material 260. The uneven thickness of polycrystalline diamond material 260 occurs because of the manner in which frame structure 230 is placed for the CVD growth process. The post-growth formation stage 200B shows that growth of polycrystalline diamond material following the contour of frame structure 230 at the edges of single crystal diamond 230. Hence, upon removal of frame structure 240 and masking material 250, the sides of polycrystalline diamond material 260 near single crystal diamond 230 would be relatively thicker.

Nevertheless, the uneven thickness of polycrystalline diamond material 260 can be evened out by way of polishing (i.e., mechanical polishing) if the embedded single crystal diamond material is relatively thick, in one embodiment. Alternatively, the uneven thickness of polycrystalline diamond material 260 can be evened out by way of etching (i.e., reactive ion etching (RIE)) if the single crystal diamond 230 is relatively thin. In one embodiment, when the evening process is performed only to the extent of the removing uneven thickness of polycrystalline diamond material 260 without directly or indirectly impacting remaining surface area of polycrystalline diamond material 260 and single crystal diamond 230, then the surface roughness of top surface of polycrystalline diamond material 260 at now evened out part may be different than the remaining surface are of polycrystalline diamond material 260.

Figure 3:
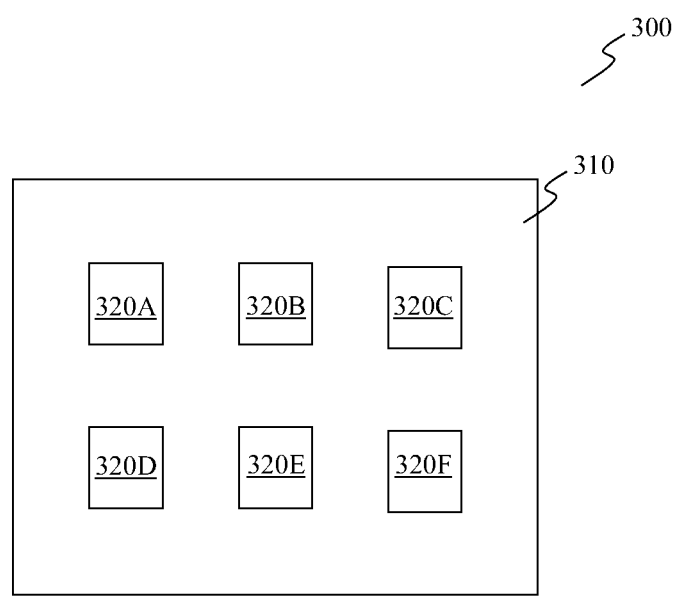
FIG. 3 shows an illustrative single crystal diamond array in a polycrystalline frame in accordance with one embodiment of the present invention.

FIG. 3, meant to be illustrative and not limiting, illustrates a single crystal diamond array in a polycrystalline diamond frame in accordance with one embodiment of the present invention. Single crystal diamond array 300 includes six single crystal diamonds 320A-320F affixed in a polycrystalline frame 310. In one embodiment, single crystal diamond array 300 may include at least more than one single crystal diamonds. The quality of single crystal diamonds 320A-320F may be similar, in one embodiment. Alternatively, and depending on the application, the quality (e.g., size, thickness, origin (e.g., mined or grown), type (e.g., Ia, Ib, IIa or IIb), purity, colour, material, dopants) of single crystal diamonds 320A-320F may be different.

Method of forming single crystal diamond array 300 is similar to method of forming embedded single crystal diamond 130 of FIGS. 1A and 1B and embedded single crystal diamond structure as shown in FIGS. 2A-2C. The only difference would be tiling up of single crystal diamonds 320A-320F prior to the growth of polycrystalline 310. In one embodiment, the single crystal diamonds 320A-320F may be arranged at precise locations on the non-diamond substrate and enable growth to connect these single crystal diamonds to be connected.

In one embodiment, embedded single crystal diamond structure 130 allows formation of an array of single crystal diamonds. It should be appreciated that there are many applications of such array. In one embodiment, the single crystal diamond array can be used as individual substrate that can be formed in to electronic circuitry undergoing a single stream of process rather than each individual substrate individually undergoing the stream of process. In addition to that, the array of single crystal diamond array also assists to formulate redundancies in a detector. Hence, with such redundancies, if the single crystal diamond is somewhat damage, another single crystal can be switched to replace the damage the single crystal diamond.

Figure 4:
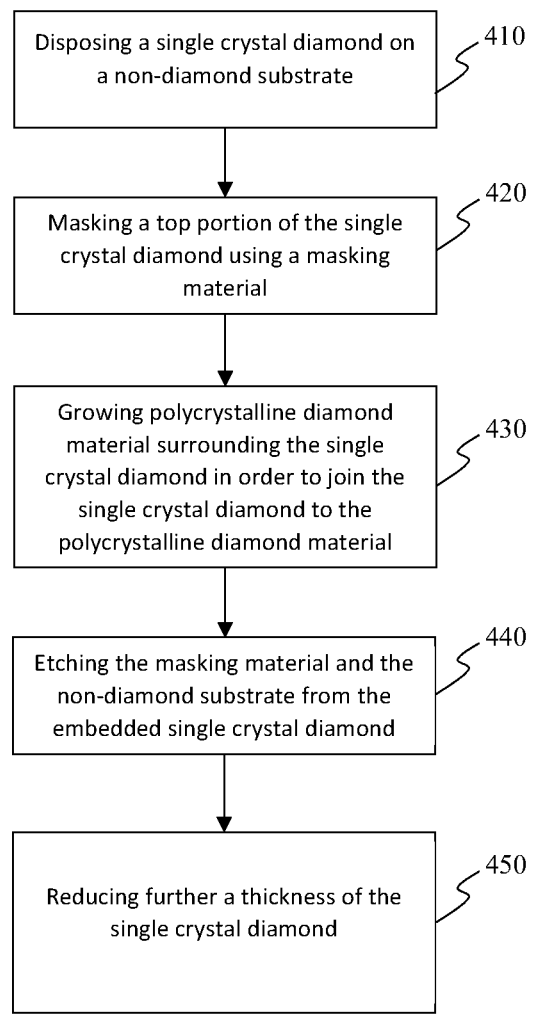
FIG. 4 shows an illustrative method of growing an embedded single crystal diamond structure n accordance with one embodiment of the present invention.

FIG. 4, meant to be illustrative and not limiting, illustrates a flowchart for a method of growing an embedded single crystal diamond structure in accordance with one embodiment of the present invention. The embedded single crystal diamond structure may be similar to embedded single crystal diamond structure 130 of FIGS. 1A and 1B or embedded single crystal diamond structure shown by final formation stage 200C of FIG. 2C.

At step 410, a single crystal diamond is disposed on a non-diamond substrate. In one embodiment, the single crystal diamond and the non-diamond substrate may be similar single crystal diamond 230 and non-diamond substrate 220 of FIGS. 2A-2C.

At step 420, a top portion of the single crystal diamond is masked using a masking material. In one embodiment, the masking material may be similar to frame structure 240 and masking material 250 of FIGS. 2A and 2B. The masking material may be provided only a selected area of the single crystal diamond. The configuration after step 420 may be similar to initial formation stage 200A as shown in FIG. 2A.

At step 430, polycrystalline diamond material is grown surrounding the single crystal diamond. Such growth of the polycrystalline diamond material joins the single crystal diamond to the polycrystalline diamond. The process of growth may be using a CVD growth method as provided in embodiment of FIG. 2B. Furthermore, the outcome immediately after step 430 may be similar to post-growth formation stage 200B of FIG. 2B.

At step 440, the masking material and non-diamond substrate are etched away from the embedded single crystal diamond. In one exemplary embodiment, the outcome immediately after step 440 may be similar to final formation stage 200C of FIG. 2C.

Optionally, at step 450, the single crystal diamond that is embedded within the embedded single crystal diamond can be etched to reduce its thickness. The etching can be performed using RIE, in one embodiment. The capability to thin down is essential for the purposes of forming a thin-film diamond with thickness of less than 20 μm and at the same time feasible to be handled. In one embodiment, the final structure subsequent to thinning may be similar to the "valley-like" surface or a dumbbell like structure.

It is apparent to a person skilled in the art that many modifications, alternatives and variations may be made to the preferred embodiment of the present invention as described above without departing from the spirit and scope of the present invention. Accordingly, it is intended to embrace all such modifications, alternatives and variations that fall within the scope of the included claims.

Reference to any prior art in the specification is not, and should not be taken as, an acknowledgment or any form of suggestion that this prior art forms part of the common general knowledge.

Many modifications may be made to the preferred embodiment of the present invention as described above without departing from the spirit and scope of the present invention.

It will be understood that the term "comprises" or its grammatical variants as used in this specification and claims is equivalent to the term "includes" and is not to be taken as excluding the presence of other features or elements.

In one embodiment, a method of a growing an embedded single crystal diamond structure, comprising:
disposing a single crystal diamond on a non-diamond substrate, wherein the non-diamond substrate is larger than the single crystal diamond;
masking a top portion of the single crystal diamond using a masking material; and using a chemical vapor deposition (CVD) growth chamber, growing polycrystalline diamond material surrounding the single crystal diamond in order to join the single crystal diamond to the polycrystalline diamond material.

The abovementioned method further comprising:
etching the masking material and the non-diamond substrate from the embedded single crystal diamond structure.

The abovementioned method further comprising:
further reducing a thickness of the single crystal diamond that is embedded in the embedded diamond single crystal structure.

The abovementioned method, wherein the non-diamond substrate is a silicon substrate.

The abovementioned method, the masking of the top portion of the single crystal diamond further comprises:
disposing a frame structure on the top portion of the single crystal diamond, wherein the frame structure is contacting a peripheral area that is protectable from growth; and
disposing a blocking structure on top of the frame structure, wherein the blocking structure blocks growth of polycrystalline diamond material.

The abovementioned method, wherein the polycrystalline diamond material that is growth is having similar purity as the single crystal diamond.

The abovementioned method, further comprising:
polishing a planar surface of the embedded single crystal diamond structure.

The abovementioned method, wherein a thickness of the non-diamond substrate is more than 1 millimeter (mm).

The abovementioned method, wherein the single crystal diamond is one of a plurality of single crystal diamonds disposed on the non-diamond substrate, and wherein the single crystal diamond joined with each other though polycrystalline diamond.

The abovementioned method, wherein h single crystal diamond is a thin-film single crystal diamond.

In another embodiment, an embedded single crystal diamond structure comprising:
a. a single crystal diamond; and
b. a polycrystalline diamond surrounding at least one edge of the single crystal diamond, wherein the single crystal diamond is suspended between a thickness of the polycrystalline diamond.

The abovementioned embedded single crystal diamond is a thin-film single crystal diamond.

The abovementioned embedded single crystal diamond is a chemical vapor deposition (CVD) diamond.

The abovementioned embedded single crystal diamond structure, wherein the single crystal diamond is having a thickness of less than 10 microns ($\mu$m).

The abovementioned embedded single crystal diamond structure, wherein the single crystal diamond is having an area of 1.0 millimeter$^2$ (mm$^2$)×1.0 mm or larger.

The abovementioned embedded single crystal diamond structure, wherein the thickness of polycrystalline diamond is having a thickness of more than 3 mm.

The abovementioned embedded single crystal diamond structure, wherein the single crystal diamond and the polycrystalline diamond are having identical purity.

The abovementioned embedded single crystal diamond structure, wherein the single crystal diamond is one in a plurality of single crystal diamonds, and wherein all of the plurality of single crystal diamonds are structurally held together using polycrystalline diamond.

In one embodiment, a method of growing an embedded single crystal diamond structure is provided. The method includes a step to dispose a single crystal diamond on a non-diamond substrate, wherein the non-diamond substrate is larger than the single crystal diamond. The method further includes a step to mask a top portion of the single crystal diamond using a masking material. Finally, the method includes a step to grow polycrystalline diamond material surrounding the single crystal diamond in order to join the single crystal diamond to the polycrystalline diamond using a chemical vapor deposition (CVD) growth method. The method forms an embedded single crystal diamond structure includes a single crystal diamond and a polycrystalline diamond. The polycrystalline diamond surrounds the single crystal diamond, wherein the single crystal diamond is suspended between the polycrystalline diamonds.

The abovementioned embedded single crystal diamond structure, wherein the single crystal diamond is one in a plurality of single crystal diamonds, and wherein all of the plurality of single crystal diamonds are structurally held together using polycrystalline diamond.

In some embodiment, a method of growing an embedded diamond structure is provided. The method includes a step to dispose at least one single crystal diamond on a non-diamond substrate, wherein the non-diamond substrate is larger than the single crystal diamond. The method further includes a step to mask a top portion of the single crystal diamond using a masking material. Finally, the method includes a step to grow polycrystalline diamond material surrounding the single crystal diamond in order to join the single crystal diamond to the polycrystalline diamond using a chemical vapor deposition (CVD) growth method. The method forms an embedded single crystal diamond structure includes a single crystal diamond and a polycrystalline diamond. The polycrystalline diamond surrounds the single crystal diamond, wherein the single crystal diamond is suspended between the polycrystalline diamonds.

The invention claimed is:

1. A method of growing an embedded single crystal diamond structure, comprising:
   disposing a single crystal diamond on a non-diamond substrate, wherein the non-diamond substrate is larger than the single crystal diamond;
   masking a top portion of the single crystal diamond using a masking material, wherein the masking the top portion of the single crystal diamond comprises disposing a frame structure on the top portion of the single crystal diamond, wherein the frame structure is contacting a peripheral area that is protectable from growth, and disposing a solid blocking structure on top of the frame structure, wherein the solid blocking structure blocks growth of diamond material, wherein the frame structure prevents contact of the solid blocking structure with the single crystal diamond, and wherein the frame structure and solid blocking structure prevents any growth within the peripheral area; and
   using a chemical vapor deposition (CVD) growth chamber, growing polycrystalline diamond material surrounding the single crystal diamond in order to join the single crystal diamond to the polycrystalline diamond material.

2. The method as defined in claim 1, further comprising: etching the masking material and the non-diamond substrate from the embedded single crystal diamond structure.

3. The method as defined in claim 1, further comprising: further reducing a thickness of the single crystal diamond that is embedded in the embedded diamond single crystal structure.

4. The method as defined in claim 1, wherein the non-diamond substrate is a silicon substrate.

5. The method as defined in claim 1, wherein the single crystal diamond has a thickness of 20 $\mu$m or less.

6. The method as defined in claim 1, further comprising: polishing a planar surface of the embedded single crystal diamond structure.

7. The method as defined in claim 1, wherein a thickness of the non-diamond substrate is more than 1 millimeter (mm).

8. The method as defined in claim 1, wherein the single crystal diamond is one of a plurality of single crystal diamonds disposed on the non-diamond substrate, and wherein the single crystal diamond joined with each other through polycrystalline diamond.

9. The method as defined claim 1, wherein the single crystal diamond is has a thickness of 2 $\mu$m or less.

* * * * *